United States Patent [19]

Hubert et al.

[11] Patent Number: 4,921,724
[45] Date of Patent: May 1, 1990

[54] PROCESS FOR COATING A SUBSTRATE WITH AN ORGANIC COATING HAVING GRADATED HARDNESS

[75] Inventors: Peter Hubert, Alzenau; Barbara Kussel, Rodgau; Peter Wirz, Waldernbach, all of Fed. Rep. of Germany

[73] Assignee: Leybold-Aktiengesellschaft, Hanau, Fed. Rep. of Germany

[21] Appl. No.: 119,627

[22] Filed: Nov. 12, 1987

[30] Foreign Application Priority Data

Jun. 12, 1987 [DE] Fed. Rep. of Germany ....... 3719616

[51] Int. Cl.$^5$ .................... B05D 3/06; C07C 3/24
[52] U.S. Cl. ...................... 427/41; 427/256; 204/168
[58] Field of Search ............ 204/192.13, 192.16, 204/192.15, 192.22, 168; 427/41, 256

[56] References Cited

U.S. PATENT DOCUMENTS

| | | | |
|---|---|---|---|
| 4,043,889 | 8/1977 | Kochel | 204/192.13 |
| 4,201,645 | 5/1980 | Riegert | 204/192.13 |
| 4,283,260 | 8/1981 | Thomas et al. | 204/192.13 |
| 4,663,008 | 5/1987 | Takeoka et al. | 204/192.15 |
| 4,713,288 | 12/1987 | Kokaku et al. | 204/192.16 |
| 4,737,415 | 4/1988 | Ichijo et al. | 427/41 |
| 4,755,426 | 7/1988 | Kokai et al. | 427/41 |

*Primary Examiner*—John F. Niebling
*Assistant Examiner*—Steven P. Marquis
*Attorney, Agent, or Firm*—Felfe & Lynch

[57] ABSTRACT

In an apparatus for coating a substrate with an organic substance by placing the substrate in a coating chamber containing a gaseous hydrocarbon compound, in which the hydrocarbon compound can be broken down by means of a cathode system having magnets, a plasma is formed in the vicinity of the substrate by applying a radiofrequency voltage to the cathode system while the substrate is held immediately in front of the cathode. The pressure in the coating chamber and the supply of the electric energy from the generator to the cathode are variable for the purpose of achieving a coating quality that will change during the build-up of the coating. For this purpose, electric motor-powered valve means are inserted into the gas supply line and into the pump suction line and are operated through a timing mechanism or a control apparatus which is connected to a vacuum gauge.

3 Claims, 4 Drawing Sheets

PROCESS FOR COATING A SUBSTRATE WITH AN ORGANIC COATING HAVING GRADATED HARDNESS

BACKGROUND OF THE INVENTION

The invention relates to a process and an apparatus for coating a substrate with an organic coating by bringing the substrate into a coating chamber containing a gaseous hydrocarbon compound, in which the hydrocarbon compound can be decomposed by means of a cathode system having a magnet, while a plasma forming in the vicinity of the substrate can be excited by applying a radiofrequency voltage to the cathode system and holding the substrate directly in front of the cathode.

It is known to apply a thin coating to thin substrate, such as data storage or sound recording media, by means of an ionized atmosphere or by plasma-supported continuous vapor depositing, radiofrequency energy being used to excite the plasma while the chemical reaction is concentrated in front of the cathode by means of a magnet system. Since the storage density of magnetic storage media is very greatly determined by the thickness of the magnetic coating and the distance of the recording head from this coating, very thin coatings and especially close head spacing are desired. Experience shows, however, that this also increases the danger of damage to the coating by contact of the head with the coating, caused, for example, by vibration or by dust particles. On the other hand, however, the wear on the magnet head, especially in start-stop operation, must be kept as low as possible. Since it is possible with the prior-art coating methods to produce only a single coating with a very homogeneous structure, the manufacturer of such media has to compromise with regard to the coating quality.

The present invention sets for itself the task of creating a process and an apparatus which will be suitable on the one hand for producing a very thin coating which will be gentle on recording head, and on the other hand the task of producing a coating that will be comparatively insensitive to damage.

SUMMARY OF THE INVENTION

The pressure in the coating chamber and the feeding of the electric energy from the generator to the cathode are specifically controlled for the purpose of achieving a coating quality that will change during the creation of the coating, and the hardness, the coefficient of friction and the index of refraction of the coating will be given a specific gradation by increasing the pressure in the coating chamber or by reducing the energy input.

In an apparatus suitable for the performance of this process, valve means are inserted into the gas line leading from the gas supply tank to the coating chamber and into the pump suction line connecting the vacuum pump to the coating chamber, whereby the pressure prevailing in the coating chamber and the throughput of the gas can be regulated.

For this purpose the valve means inserted into the gas supply line and into the pump suction line are preferably operated hydraulically or pneumatically under the control of a timing mechanism.

It is desirable for the power output of the generator connected to the electrical line supplying the cathode to be controllable by means of an electrically, hydraulically or pneumatically operated adjusting means under the control of a timing mechanism or of a control apparatus.

In order to produce a coating with a gradated hardness, in which a softer surface coating follows onto a preceding harder protective coating, the timing mechanism and/or the control apparatus cooperate with a vacuum gauge which is in communication with the coating chamber and which produces the control signals corresponding to the pressure in the coating chamber and feeds them to the timing mechanism or to the control apparatus.

Advantageously, the timing mechanism and/or the control apparatus cooperate with a flow meter which is inserted into the gas supply line between the gas tank and the valve means, and which produces signals corresponding to the flow of gas to the coating chamber and feeds them to the timing mechanism or to the control apparatus.

In a preferred embodiment, the magnets producing a magnetic field in front of the cathode are disposed movably with their mounting on the cathode holder, and can be rotated by means of separate motors thereby achieving an especially uniform coating thickness.

DETAILED DESCRIPTION OF PREFERRED EMBODIMENT

Figure 1:
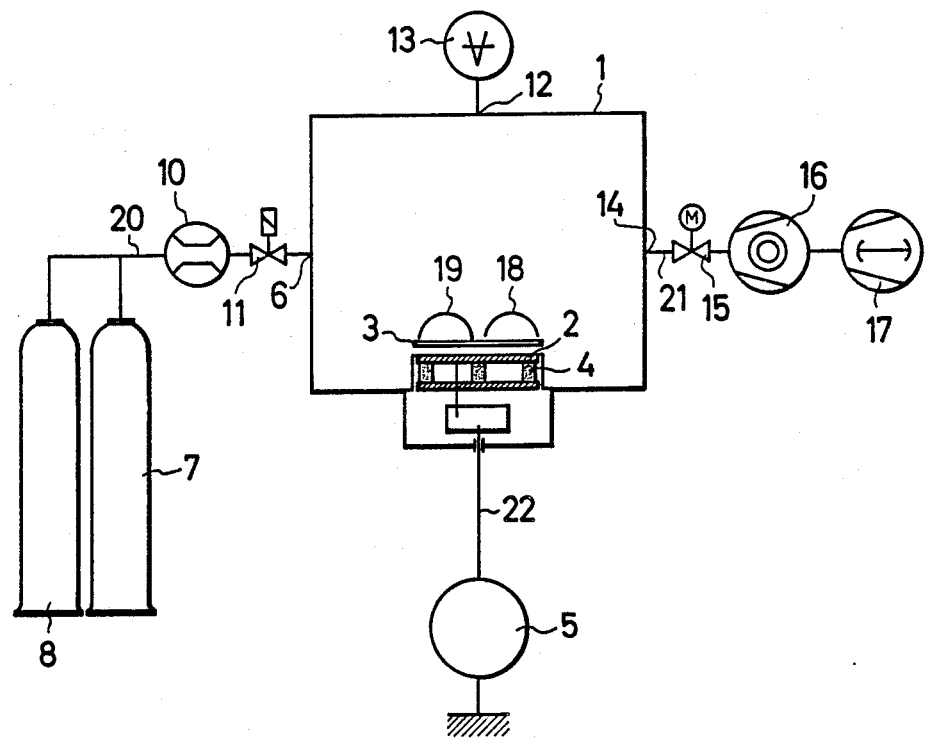
FIG. 1 is a diagrammatic representation of an apparatus for coating data storage media with an organic protective coating by breaking down a gaseous hydrocarbon compound.

The apparatus consists essentially of the coating chamber 1 with the cathode 2 disposed therein, the substrate 3 disposed above the cathode 2, the magnets 4 pertaining to the cathode 2, the electric power source 5, the connection 6 for the gas bottles 7 and 8, the flow meter 10 inserted into the gas feed line 20 with the magnetically operated valve means 11, the vacuum meter cell 13 connected by connection 12 to the coating chamber 1, and an electric motor-powered valve means which is connected to the coating chamber 1 through a connection 14 for controlling the turbo vacuum pump 16, and the rotary piston vacuum pump 17 connected to the output thereof.

After the substrate 3 has been admitted through a lock into the evacuated coating chamber 1, plasma tubes 18 and 19 form on the side of the substrate 3 facing away from the cathode 2, due to the decomposition of the monomer (e.g., acetylene gas) introduced through the connection 6, radiofrequency energy (e.g., 13.56 MHz) produced by the energy source 5 or the generator being applied to the cathode 2 for the excitation of the plasma. If desired, an inert gas, e.g., argon, can be mixed with the acetylene gas. By adjusting the process parameters the properties of the coating can be varied; in particular, the mechanical properties such as hardness and friction coefficient can be varied continuously in the course of the coating, so that a gradated hardness forms such that a softer surface coating follows a harder protective coating. With this gradation it is brought about that, while having optimum protective action for the substrate—e.g., a data storage medium, the wear on a magnet head cooperating with the data medium is minimized.

A change in the input power produces a change of the energy of the particles impinging upon the substrate 3 and hence a structure change. Thus, gradations can be produced within the coating by shifting from one power level to the next during the coating.

The substrate or data storage medium is best provided first with a relatively hard protective coating and, while this coating is being applied, the power and the pressure are varied such that the surface receives a coating which is softer and thus has good antifriction properties. In this manner, the hardest possible coating for the protection of the magnetic coating is combined in a single coating process with a softer coating of low friction coefficient that is especially desirable for start-stop operation.

Figure 2:
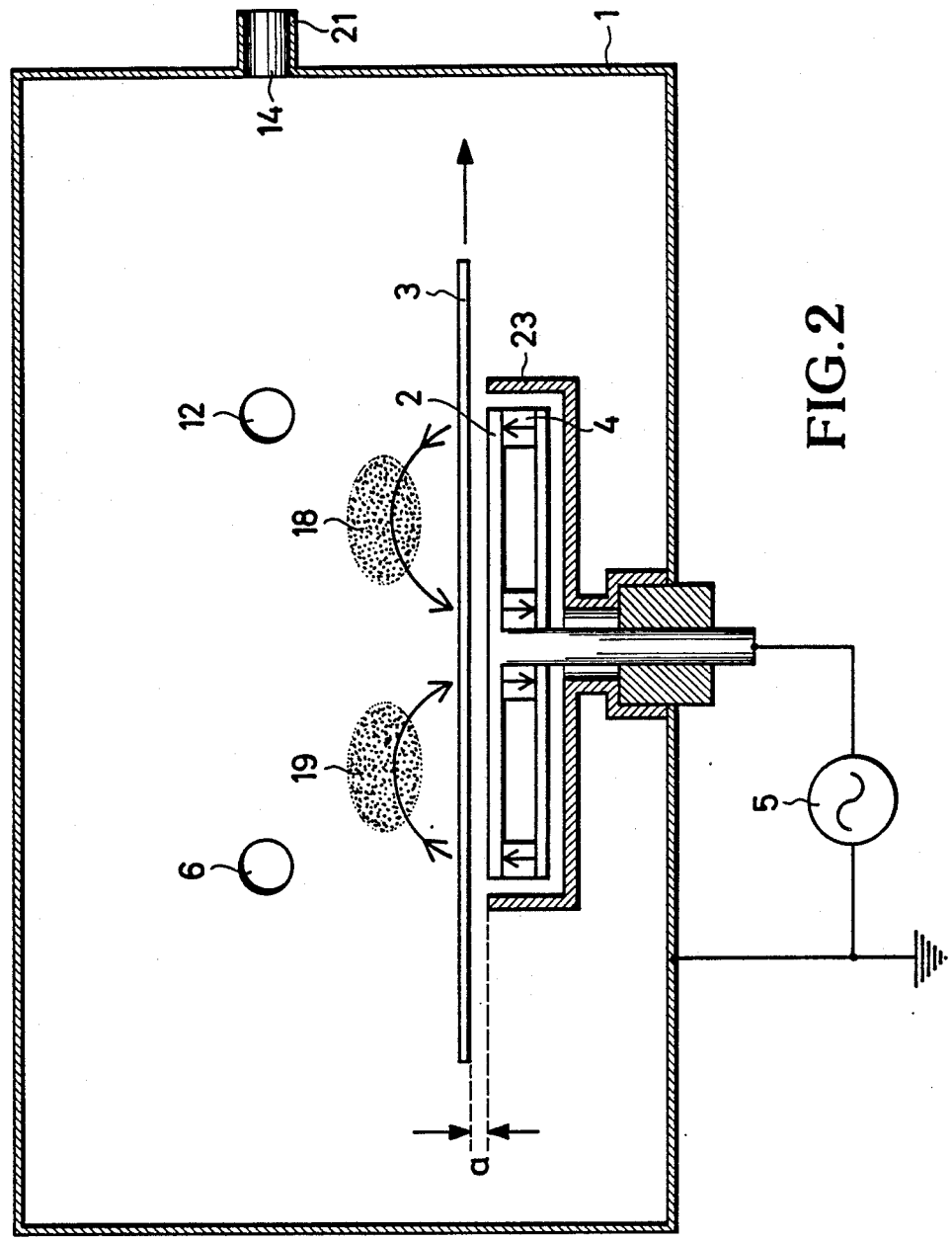
FIG. 2 is a purely diagrammatic drawing on an enlarged scale of a cathode for an apparatus according to FIG. 1, wherein the plasma that forms in operation and the lines of force produced by the magnet are indicated by dotted areas and by arrows.

The example shown in FIG. 2, of a variant embodiment of a cathode arrangement, the dark-space gap a between the substrate 3 and the cathode 2 is made vary narrow, so as to assure that no plasma cloud will form in the space between the substrate 3 and the cathode 2, i.e., the dark-space distance that establishes itself under the chosen process parameters (e.g., pressure and power) must not be exceeded.

Figure 3:
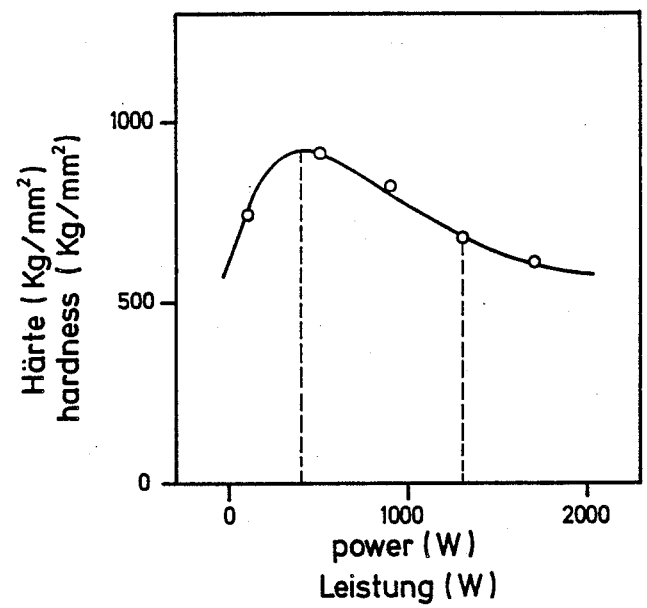
FIGS. 3 to 6 are graphs representing the physical values of coatings which can be achieved by the process.
Figure 4:
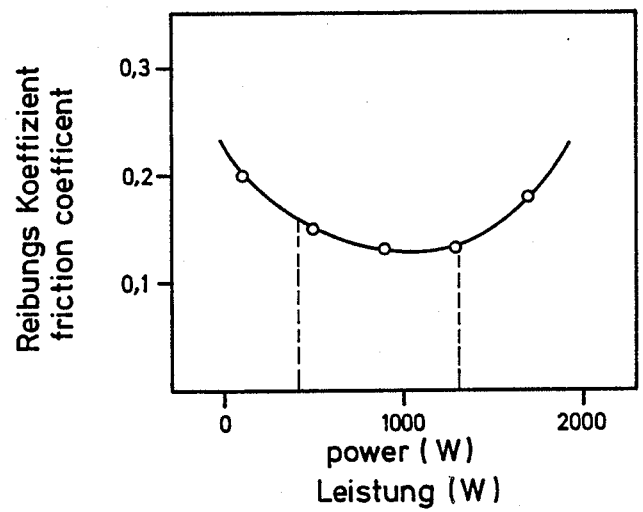
Figure 5:
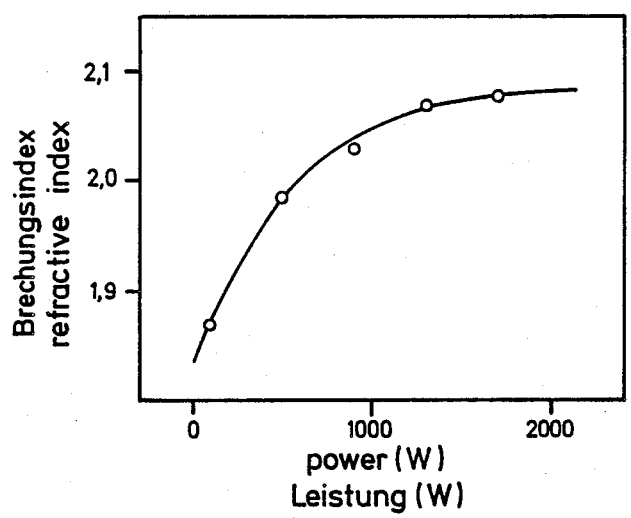
Figure 6:
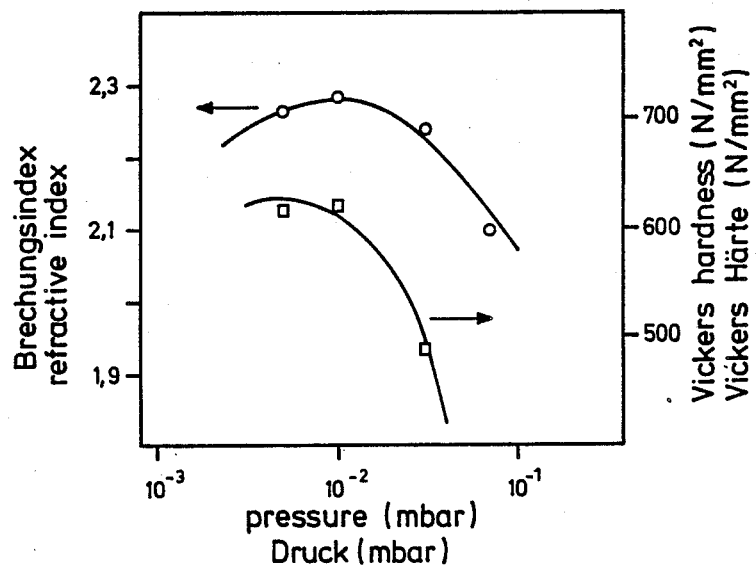

In FIG. 3 the dependency between the hardness of the coating and the electrical voltage applied during the coating process is shown in a graph. It can be seen that a hardness maximum is achievable at a power of about 400 W. FIG. 4 shows that a minimum friction coefficient is established at about 1,000 W, and that at lower or higher power the friction coefficient approaches a maximum. As FIG. 5 shows, the refractive index also depends on the applied electric power, increasing as the power increases, until at about 2,000 W power it reaches a maximum level. In the graph in FIG. 6, it is shown that the refractive index and coating hardness also depend on the pressure prevailing in the coating chamber 1 during the coating process. Both of these values reach a maximum at a pressure of about 0.001 mbar.

What is claimed is:

1. A process for coating a substrate with an organic coating, comprising the following steps
    placing the substrate in an evacuable coating chamber having a cathode system equipped with magnets,
    introducing a hydrocarbon gas into said chamber,
    producing a plasma in the area of the substrate by applying a radiofrequency voltage to said cathode system, and
    varying the pressure of hydrocarbon gas in the coating chamber and the power applied to the cathode system so that a coating derived from said hydrocarbon gas and having a gradated hardness is formed on the substrate, a relatively hard protective coating being formed first, followed by a softer surface coating.

2. A process as in claim 1 wherein the power applied to the cathode system is decreased as the coating is formed.

3. A process as in claim 1 wherein the pressure maintained in the chamber is increased as the coating is formed.

* * * * *